United States Patent
Yoshinari et al.

(10) Patent No.: US 7,899,602 B2
(45) Date of Patent: Mar. 1, 2011

(54) ENGINE CONTROL UNIT

(75) Inventors: Hideto Yoshinari, Hitachinaka (JP); Yujiro Kaneko, Hitachinaka (JP); Masahiko Asano, Mito (JP); Nobutake Tsuyuno, Tokai (JP); Takehide Yokozuka, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 482 days.

(21) Appl. No.: 12/126,504

(22) Filed: May 23, 2008

(65) Prior Publication Data
US 2008/0294324 A1 Nov. 27, 2008

(30) Foreign Application Priority Data
May 24, 2007 (JP) .............................. 2007-137784

(51) Int. Cl.
G06F 19/00 (2006.01)
F02M 51/00 (2006.01)
H05K 7/20 (2006.01)

(52) U.S. Cl. ........................ 701/104; 123/490; 361/155; 361/714

(58) Field of Classification Search ............ 123/406.47, 123/472, 478, 480, 486, 490; 701/101–105, 701/115; 361/152–156, 707–710, 714, 796, 361/797, 800
See application file for complete search history.

(56) References Cited

U.S. PATENT DOCUMENTS

| 6,360,725 B1 * | 3/2002 | Scherrbacher | 123/490 |
| 6,508,232 B2 * | 1/2003 | Sogawa | 123/478 |
| 7,417,873 B2 * | 8/2008 | Kadoya et al. | 361/797 |
| 7,578,284 B2 * | 8/2009 | Mayuzumi et al. | 123/490 |
| 2005/0094356 A1 | 5/2005 | Onizuka et al. | |
| 2008/0316670 A1 * | 12/2008 | Matsuura | 361/152 |
| 2009/0063014 A1 * | 3/2009 | Tokugawa et al. | 701/103 |

FOREIGN PATENT DOCUMENTS

| JP | 7-29873 U | 6/1995 | |
| JP | 10176641 A * | 6/1998 | 701/102 |
| JP | 2004-119533 A | 4/2004 | |
| JP | 2005-143193 A | 6/2005 | |
| JP | 2006-336536 A | 12/2006 | |
| JP | 2007-109994 A | 4/2007 | |

OTHER PUBLICATIONS

Japanese Office Action dated Aug. 25, 2009 (three (3) pages).

* cited by examiner

Primary Examiner—Willis R Wolfe, Jr.
(74) Attorney, Agent, or Firm—Crowell & Moring LLP

(57) ABSTRACT

An engine control unit for controlling an automobile engine, which is equipped with a booster circuit for boosting the voltage of battery power source, an injector driving circuit for driving an injector by making use of a boosted high voltage, and a microcomputer for controlling the engine; wherein the engine control unit is featured in that an LC module mounted with a booster coil constituting the booster circuit and with an electrolytic capacitor, a power module mounted with a rectifying device constituting the booster circuit and the injector driving circuit and with a switching device, and a control circuit board mounted with the microcomputer and with a connector acting as an interface for an external member of the engine control unit are laminated each other. The power module is partitioned into at least two portions and fixedly contacted, through a heat radiation part, with a housing cover, and heat radiation fins are arranged on an outer surface of the housing cover where the power module is disposed.

9 Claims, 4 Drawing Sheets

ENGINE CONTROL UNIT

BACKGROUND OF THE INVENTION

1. Field of the Invention

The present invention relates to an engine control unit to be used in an automobile. In particular, the present invention relates to an engine control unit which is improved in heat radiation performance, thereby making it possible to enhance the reliability thereof and to miniaturize the control unit.

2. Description of the Related Art

In the case of the engine control unit for automobiles, motorcycles and the like where gasoline or light oil is employed as a fuel, there has been conventionally employed an engine control unit provided with an injector for injecting the fuel directly into the cylinder of engine in order to enhance the fuel consumption and output of engine. The injector of this kind is called "in-cylinder direct injection type injector", "direct injection injector" or "DI (Direct Injection)". Since the engine employing this in-cylinder direct injection type injector is required to use a fuel which is pressurized at a high pressure, a relatively high output is required for driving and controlling the injector as compared with the fuel-injecting system adopted at present as a mainstream in the gasoline engine wherein the fuel is mixed at first with air to form an air-fuel mixture, which is then injected into the cylinder. Furthermore, in order to cope with the high-speed rotation of engine by improving the drive control of injector, the aforementioned high output is required to be transmitted to the injector within a short period of time.

In the case of the engine control unit where a higher output is demanded as described above, heat is caused to develop from the switching devices (for example, MOSFET (Metal-Oxide Semiconductor Field-Effect Transistor), IGBT (Insulated Gate Bipolar Transistor)) and a rectifying device (for example, Diode) employed for constituting an injector drive circuit; from a booster coil constituting a booster circuit; and from an electrolytic capacitor during the drive control of the injector. Therefore, for the purpose of enhancing the heat radiation performance of the engine control unit, there has been adopted a packaged structure which is designed such that it is provided with a heat-dissipating member through which the developed heat is enabled to radiate from a control circuit board equipped with the aforementioned electronic components to a housing base constituting an outer casing.

For example, JP Published Patent Application No. 2004-119533 describes a packaged structure of the engine control unit wherein a heat-dissipating sheet is employed.

According to this conventional packaged structure of the engine control unit, the control circuit board thereof becomes larger in size as the number of electronic components to be mounted on the control circuit board is increased, giving rise to the increase in size of the engine control unit. In recent years, there has been an increasing trend to increase the ratio of living space (indoor space) to the entire vehicle size in order to pursue comfortableness of ride, so that the space available for mounting the engine control unit is increasingly limited. Therefore, the miniaturization of the engine control unit is now becoming an indispensable theme to overcome.

Further, in the case of the engine control unit where a higher output is demanded as described above, a packaged structure which is designed such that the heat developed from electronic components is transmitted to the control circuit board and then radiated from the bottom surface of the control circuit board is accompanied with a problem that, since the control circuit board which is made of a resinous material is low in thermal conductivity, the heat radiation performance thereof would be insufficient even if it is tried to transmit the heat developed from the electronic components to the housing and to radiate the heat from the housing. Additionally, it would be difficult to secure the reliability of the engine control unit when the engine control unit is used in severe automobile operation conditions.

BRIEF SUMMARY OF THE INVENTION

The present invention has been made in view of the problems mentioned above and, therefore, an object of the present invention is to provide an engine control unit which, in a packaged structure thereof, is capable of improving the heat radiation and reliability and also capable of miniaturizing the structure thereof.

The engine control unit according to the present invention for controlling an automobile engine as one representative embodiment thereof is featured in that the control unit is equipped with a booster circuit for boosting the voltage of battery power source, an injector driving circuit for driving an injector by making use of a boosted high voltage, and a microcomputer for controlling the engine; that an LC module mounted with a booster coil constituting the booster circuit and with an electrolytic capacitor, a power module mounted with a rectifying device constituting the booster circuit and the injector driving circuit and with a switching device, and a control circuit board mounted with the microcomputer and with a connector acting as an interface for an external member of the engine control unit are laminated each other; that the power module is partitioned into at least two portions and fixedly contacted, through a heat radiation part, with a housing cover; and that heat radiation fins are arranged on an outer surface of the housing cover where the power module is disposed.

According to the present invention, it is possible to provide an engine control unit which can be miniaturized while making it possible to improve the heat radiation performance and reliability thereof.

DETAILED DESCRIPTION OF THE INVENTION

Next, specific embodiments of the present invention will be explained in detail with reference to drawings.

Figure 1:
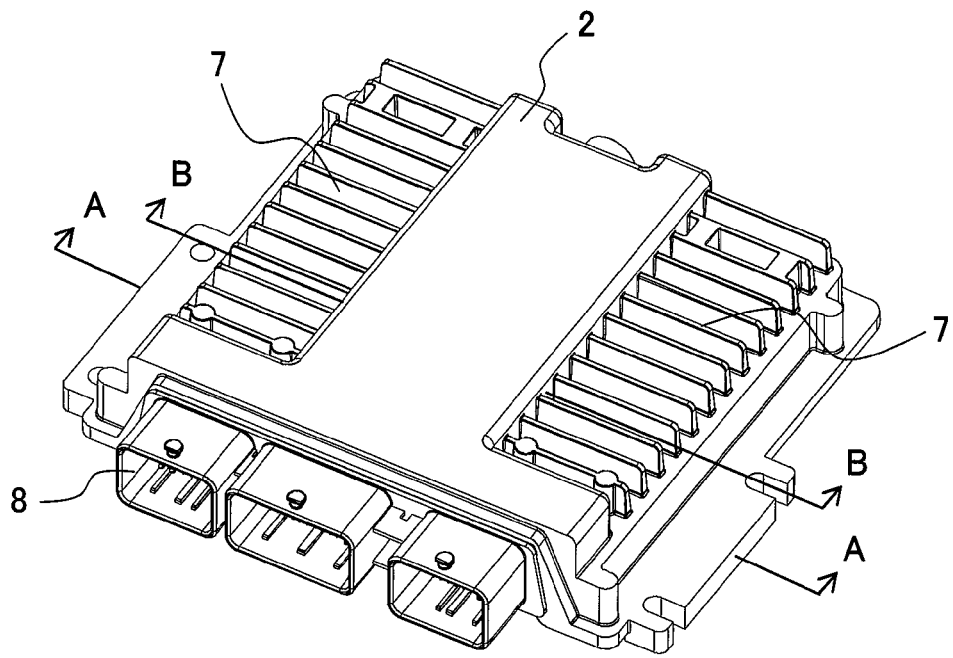
FIG. 1 is a perspective view showing the entire structure of the engine control unit according to one embodiment of the present invention.
Figure 2:
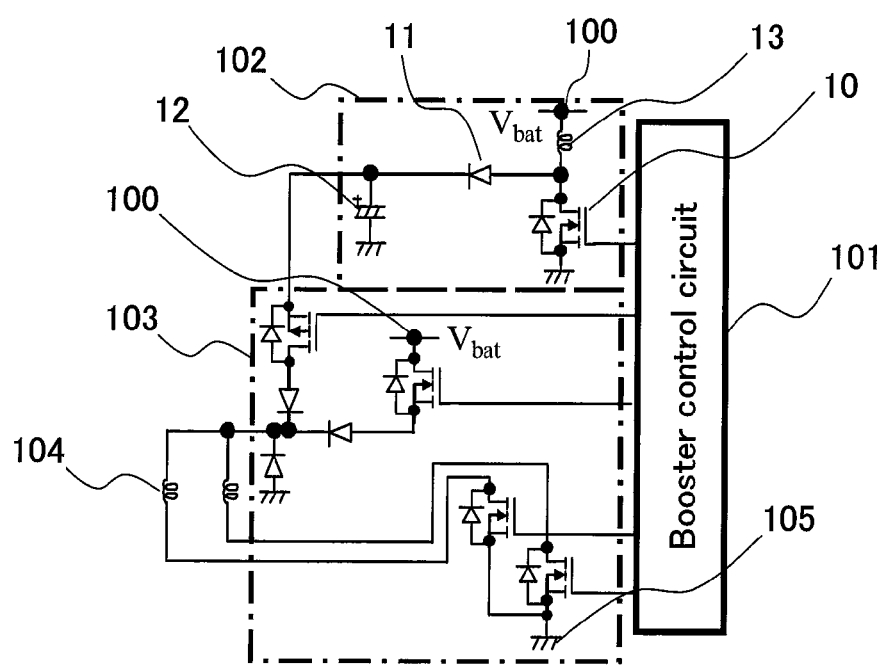
FIG. 2 is a circuit diagram of the engine control unit according to one embodiment of the present invention.
Figure 3:
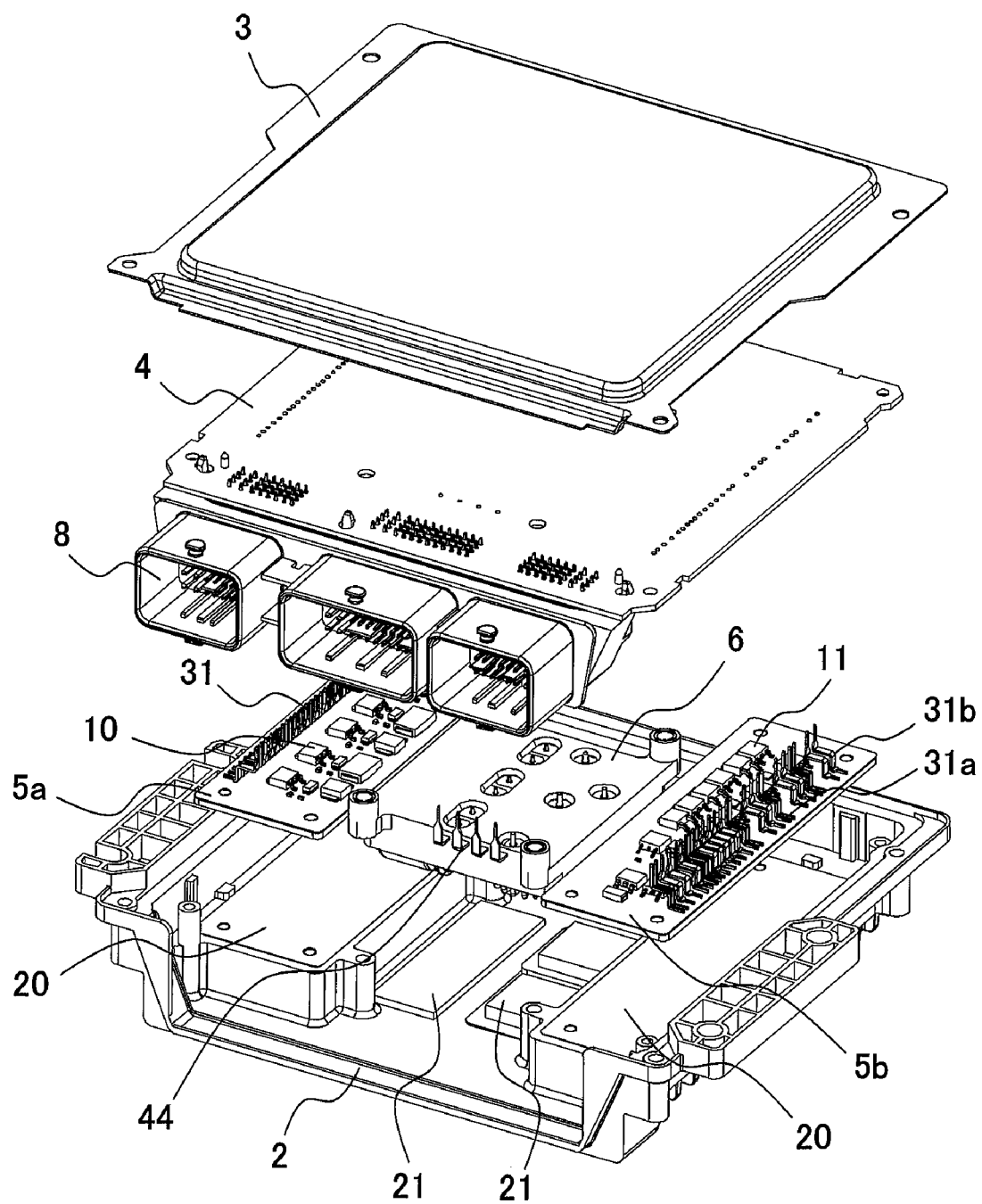
FIG. 3 is an exploded perspective view of the engine control unit shown in FIG. 1.
Figure 4:
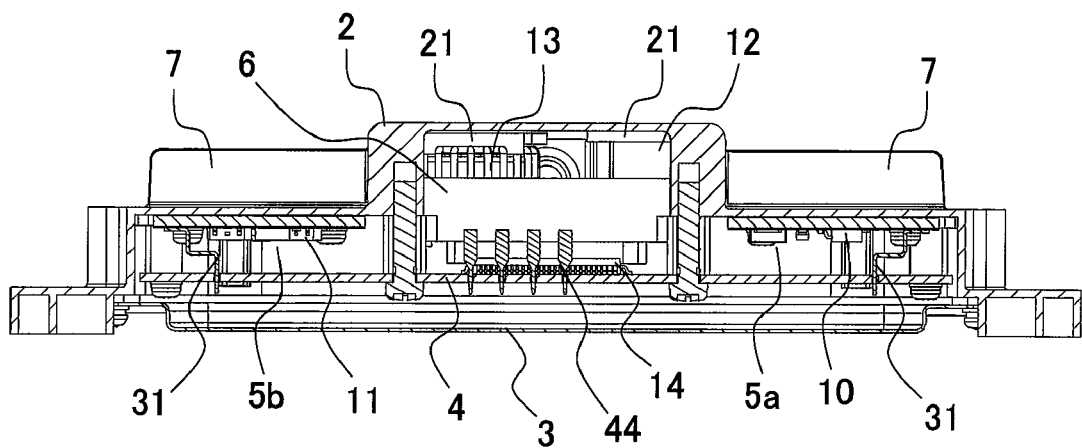
FIG. 4 is a cross-sectional view taken along the line A-A of FIG. 1.
Figure 5:
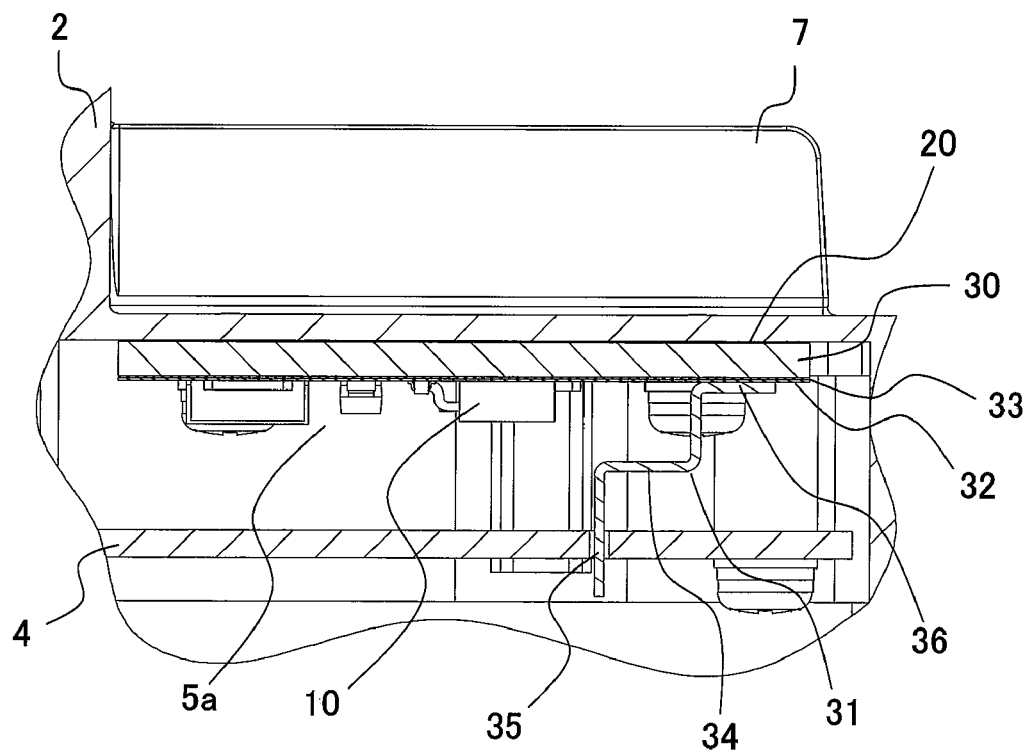
FIG. 5 is an enlarged cross-sectional view showing a main portion of the power module shown in FIG. 4.
Figure 6:
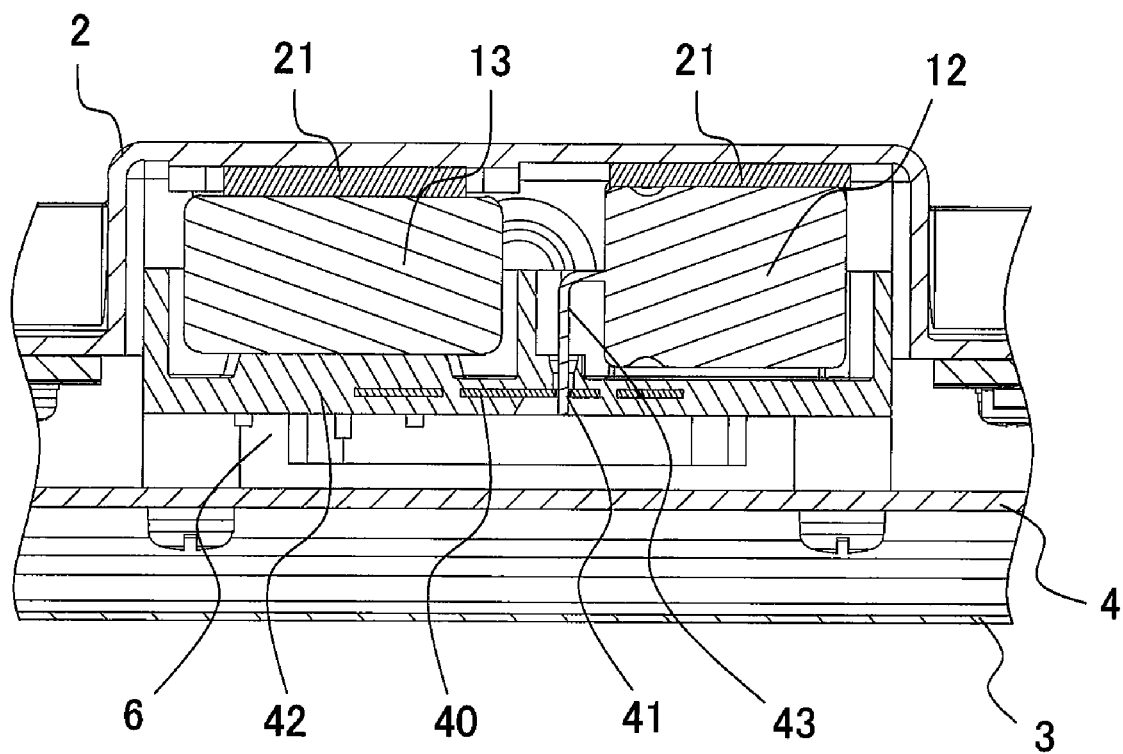
FIG. 6 is a cross-sectional view of the LC module which is taken along the line B-B of FIG. 1.

FIGS. 1-6 illustrate a preferable structure of the engine control unit representing one embodiment of the present invention. Specifically, FIG. 1 is a perspective view showing the entire structure of the engine control unit according to this embodiment; FIG. 2 is a circuit diagram of the engine control unit for controlling the operation of the injector; FIG. 3 is an exploded perspective view of the engine control unit shown in FIG. 1; FIG. 4 is a cross-sectional view taken along the line A-A of FIG. 1; FIG. 5 is an enlarged cross-sectional view showing a main portion of FIG. 4; and FIG. 6 is a cross-sectional view which is taken along the line B-B of FIG. 1.

As shown in FIGS. 1-6, in order to control an automobile engine, the engine control unit 1 of the present invention is equipped with a booster circuit 102 for boosting the voltage of battery power source 100, an injector driving circuit 103 for driving an injector 104 by making use of a boosted high voltage, and a microcomputer 14 for controlling the engine. This engine control unit 1 is further featured in that an LC module 6 mounted with a booster coil 13 constituting a portion of the booster circuit 102 and with an electrolytic capacitor 12, a power module 5a (5b) mounted with a plurality of rectifying devices 11 constituting the booster circuit 102 and the injector driving circuit 103 and with a plurality of switching devices 10, and a control circuit board 4 mounted with the microcomputer 14 and with a connector 8 acting as an interface for an external member of the engine control unit are laminated each other. This engine control unit 1 is further featured in that the LC module 6 is disposed at a central portion of a housing cover 2, that the power module is partitioned into two parts, i.e. the power module 5a and the power module 5b, and the power module 5a is disposed on one side of the LC module 6 and the power module 5b is disposed on the opposite side of the LC module 6, and that these power modules 5a (5b) are fixedly contacted, through grease 20 of high thermal conductivity, with the housing cover 2. Additionally, a plurality of heat radiation fins 7 are arranged on the outer surface portions of the housing cover 2 where the power modules 5a (5b) are disposed. Furthermore, the opening of the housing cover 2 is covered with a housing base 3 so as to entirely close the engine control unit.

As described above, since the LC module 6, the power modules 5a (5b) and the control circuit board 4 are laminated each other inside the engine control unit, the electronic components which have been entirely mounted on the control circuit board 4 in the conventional engine control unit can be separately mounted on the LC module 6 and on the power modules 5a (5b), thereby making it possible to reduce the area of the control circuit board 4 and hence to reduce the size in lateral direction of the engine control unit as a whole. Furthermore, since the electronic components are assembled into module structures, i.e. the LC module 6, the power modules 5a and 5b and these module structures are secured to the housing cover 2 in such a manner that the LC module 6 is disposed at a central portion of the housing cover 2 while the power modules 5a and 5b are spaced apart and separately disposed on the opposite sides of LC module 6, the heat developed from the electronic components can be uniformly dissipated in the interior of the engine control unit 1. Additionally, since the heat radiation fins 7 are disposed as close as possible to the power module 5a (5b) carrying the rectifying devices 11 and the switching devices 10 which are electronic components releasing high exothermic heat, the heat generated from these electronic components can be very effectively radiated, via the grease 20 which is excellent in thermal conductivity, from the engine control unit into the external atmosphere.

As shown in FIGS. 4 and 5, the power modules 5a and 5b are respectively formed of a laminated structure comprising a plurality of rectifying devices 11 constituting the booster circuit 102 and the injector driving circuit 103 both designed to control the automobile engine, a wiring circuit portion 32 provided with the switching devices 10, an insulating layer 33 formed of an insulating material, and a heat radiation layer 30 for dissipating and radiating the heat generated from the rectifying devices 11 and the switching devices 10.

The rectifying devices 11 are respectively formed of a semiconductor diode, and the switching devices 10 are respectively formed of a power semiconductor element such as a MOSFET (Metal-Oxide Semiconductor Field-Effect Transistor) or an IGBT (Insulated Gate Bipolar Transistor).

Since these plurality of rectifying devices 11 and switching devices 10 are mounted on the wiring circuit portion 32 by making use of a Pb-free solder which is high in thermal conductivity and unharmful to environments, the heat generated from these rectifying devices 11 and switching devices 10 can be efficiently dissipated toward the heat radiation layer 30 of power modules 5a (5b) and then radiated therefrom.

The wiring circuit portion 32 is formed of a material which is high in thermal conductivity and low in electric resistance. The thickness of the wiring of wiring circuit portion 32 should preferably be not less than 100 μm, more preferably within the range of 100 μm-175 μm. The reason is that since a large electric current of not less than several tens amperes is required for actuating the injector of the engine control unit of the present invention, it is required to lower the electric resistance of wirings located in this circuit portion and therefore it is desirable to employ a thick copper wirings having a thickness of 100 μm or more. On the other hand, in the case of the ordinary metal base substrate, the maximum thickness thereof that can be manufactured at a lower cost is deemed to be 175 μm or so.

By constructing the engine control unit in this manner, it becomes possible to efficiently dissipate the heat generated from these rectifying devices 11 and switching devices 10 toward the heat radiation layer 30 of power modules 5a (5b) and then to radiate the heat therefrom. Additionally, it is also possible to suppress the generation of heat from the wiring circuit portion 32 itself on the occasion of passing a large electric current therethrough.

As for the insulating layer 33, it is preferable to employ a material which is excellent in thermal conductivity and in electric insulation. For example, it is possible to employ epoxy resin incorporated therein with aluminum powder which is excellent in thermal conductivity or to employ aluminum oxide, silicon nitride, aluminum nitride, etc. By making use of a material which is excellent in thermal conductivity and in electric insulation, it is now possible to efficiently dissipate the heat generated from these rectifying devices 11 and switching devices 10 toward the heat radiation layer 30 of power modules 5a (5b) and then to radiate the heat therefrom, while making it possible to secure sufficient electric insulation between the wiring circuit portion 32 and the heat radiation layer 30.

As for the heat radiation layer 30, it is preferable to employ an aluminum alloying material which is high in thermal conductivity and low in specific gravity or to employ a copper alloying material which is higher in thermal conductivity than the aluminum alloying material. Alternatively, it is also possible to employ a very low thermal expansion coefficient material such as a copper-molybdenum alloy, a copper-tungsten alloy or an aluminum-silicon-carbide. By making use of a material exhibiting a high thermal conductivity as described above, it is possible to more effectively dissipate the heat generated from the rectifying devices 11 and the switching devices 10 toward the heat radiation layer 30 of power modules 5a (5b) and then to radiate the heat therefrom.

On the wiring circuit portion 32 of the power modules 5a (5b), there are mounted, in addition to these rectifying devices 11 and switching devices 10, a plurality of external terminals 31 which are arranged in a row along the longitudinal sidewall of the power modules 5a (5b) and electrically connected with the control circuit board 4. Namely, the power modules 5a (5b) are enabled to electrically connect with the control circuit board 4 by way of these external terminals 31 which are configured to pass through the control circuit board 4. By disposing the external terminals 31 in this manner, the terminal connection of the wiring circuit portion 32 of power modules 5a (5b) can be performed unidirectionally from one side of the wiring circuit portion 32 on the occasion of electrically connecting the wiring circuit portion 32 with the external terminals 31. As a result, the workability of terminal connection can be enhanced and, at the same time, the power modules 5a (5b) can be connected with the control circuit board 4 at a minimum possible distance, thus making it possible to create a structure wherein the wiring resistance can be minimized.

Meanwhile, these external terminals 31 are constituted by a plurality of first terminals 31a for conducting a large electric current for actuating the injector and by a plurality of second terminals 31b for transmitting controlling signals. Namely, since a large electric current for actuating the injector is passed through the first terminals 31a, the width of each of the first terminals 31a is made larger than that of each of the second terminals 31b for transmitting controlling signals. However, depending on the magnitude of electric current to pass through, it is also possible to make the size and shape of the first terminals 31a identical with the size and shape of the second terminals 31b.

Preferably, these external terminals 31 are formed of a material which is low in electric resistance such as copper alloying materials, etc. Further, the cross-section of each of these external terminals 31 is configured to have a step portion 34 in the vicinity of the connecting portion between the external terminal 31 and the wiring circuit portion 32, so that even if the distance between the control circuit board 4 and the power modules 5a (5b) is caused to change due to the expansion or shrinkage of the engine control unit in conformity with ambient temperature, such a change in distance can be absorbed by the follow-up properties of the step portion 34. As a result, any stress to be generated at the connecting portion 35 between the external terminal 31 and the control circuit board 4 as well as at the connecting portion 36 between the external terminal 31 and the wiring circuit portion 32 can be alleviated by the step portion 34. As described above, the step portion 34 acts like a spring, thereby providing a stress-alleviating structure which is effective in suppressing the generation of excessive stress at the connecting portion between the wiring circuit portion and the external terminal.

Further, the connecting portion 35 between the external terminal 31 and the control circuit board 4 is achieved using a Pb-free solder. As for specific examples of the Pb-free solder, they include a Sn—Cu solder, a Sn—Ag—Cu solder, a Sn—Ag—Cu—Bi solder, etc. It is also possible to employ, other than the aforementioned soldering, solderless connection wherein the connection is effected electrically and only through contact without using solders such as press-fit connection, etc.

Further, the connecting portion 36 between the external terminal 31 and the wiring circuit portion 32 is achieved electrically by way of ultrasonic bonding. Due to the bonding using ultrasonic wave, it is made possible to realize the connection which is excellent in bonding strength and in durability as compared with the connection using the ordinary solders.

As shown in FIGS. 4 and 6, the LC module 6 is equipped with a resinous case 42 which has been manufactured by way of insert molding using a heat resistant resin and employing, as an insert, bus bar wirings 40 manufactured by means of press working using a thick copper plate as a raw material. Namely, this LC module 6 is constructed such that the booster coil 13 constituting a portion of the booster circuit 102 for controlling the automobile engine and the electrolytic capacitor 12 are mounted over the bus bar wirings 40. Furthermore, these bus bar wirings 40 are provided with bus bar external terminals 44 and hence the LC module 6 is enabled to electrically connect with the control circuit board 4 by making use of these external terminals 44 which are configured to pass through the control circuit board 4. As described above, since these bus bar wirings 40 are employed, it becomes possible to construct the booster circuit 102 by making use of wirings of very low electric resistance as compared with the wiring circuit of the control circuit board 4. Further, since these electronic components are assembled into a module, the assembling of them to the engine control unit can be facilitated. Furthermore, since these bus bar wirings 40 can be electrically connected, by way of the bus bar external terminals 44, with the control circuit board 4 at a minimum possible distance, it is now possible to create a structure wherein the electric resistance can be minimized.

Since the LC module 6 is secured, via a heat-radiating sheet 21 which is excellent in thermal conductivity, to the housing cover 2, the heat generated from the booster coil 13 and the electrolytic capacitor 12 can be effectively released out of the engine control unit 1. The heat-radiating sheet 21 should preferably be formed of a flexible material exhibiting a high thermal conductivity, thereby enabling the heat-radiating sheet 21 to easily conform to even the recessed/projected surfaces of the booster coil 13 and the electrolytic capacitor 12. Alternatively, the heat-radiating sheet 21 may be formed of an adhesive mixed with powdery materials of high thermal conductivity.

The leads 43 of these booster coil 13 and electrolytic capacitor 12 mounted over the bus bar wirings 40 are electrically connected, at the connecting portions 41, with the bus bar wirings 40 by making use of a Pb-free solder. Meanwhile, these booster coil 13 and electrolytic capacitor 12 are fixed to the resinous case 42 by means of adhesive, thereby making it possible to enhance the vibration resistance.

The housing cover 2 should preferably be formed of a metallic material which is higher in thermal conductivity as compared with other metallic materials. In viewpoints of enhancing mass-productivity, weight-saving and heat radiation property, it is more preferable to employ aluminum alloying materials. For example, it may be a cast aluminum article that can be manufactured by means of die casting. Alternatively, the housing cover 2 may be manufactured by means of cutting work.

In viewpoints of enhancing mass-productivity and weight-saving, the housing base 3 may be formed of a metallic material such, for example, as a steel housing base, an aluminum housing base, etc. both of which can be manufactured by means of press-working. Alternatively, in viewpoints of lightness and excellent heat resistance, the housing base 3 may be a heat resistance resin housing base such as a PET (Polyethylene Terephthalate) resin housing base, a PPS (Polyphenylene Sulfide) resin housing base or a PBT (Polybutylene Terephthalate) resin housing base.

Although the engine control unit of the present invention has been explained based on one embodiment thereof in the foregoing description, it should not be construed that the present invention is limited by this embodiment but should be understood that the present invention can be variously modified in the practical application thereof without departing from the scope of the general inventive concept as defined by the appended claims.

What is claimed is:

1. An engine control unit for controlling an automobile engine, which is equipped with a booster circuit for boosting the voltage of battery power source, an injector driving circuit for driving an injector by making use of a boosted high voltage, and a microcomputer for controlling the engine;

wherein the engine control unit is featured in that:

an LC module mounted with a booster coil constituting the booster circuit and with an electrolytic capacitor, a power module mounted with a rectifying device constituting the booster circuit and the injector driving circuit and with a switching device, and a control circuit board mounted with the microcomputer and with a connector acting as an interface for an external member of the engine control unit are laminated each other;

the power module is partitioned into at least two portions and fixedly contacted, through a heat radiation part, with a housing cover; and heat radiation fins are arranged on an outer surface of the housing cover where the power module is disposed.

2. The engine control unit according to claim 1, wherein the LC module is equipped with a resinous case having built-in bus bar wirings; the booster coil and the electrolytic capacitor, both electrically connected with the bus bar wirings, are mounted on the resinous case; external terminals which are formed integral with the bus bar wirings are configured to pass through the control circuit board thereby enabling the external terminals to electrically connect with the control circuit board; and surfaces of the booster coil and the electrolytic capacitor are respectively fixedly contacted, via the heat radiation part, with the housing cover.

3. The engine control unit according to claim 1, wherein the LC module 6 is disposed at a central portion of the housing cover and at least one of the power module is disposed on one side of the LC module and the rest of the power module is disposed on the opposite side of the LC module.

4. The engine control unit according to claim 1, wherein the power module comprises a heat radiation layer having a first main face and a second main face located opposite to the first main face; an insulating layer disposed on the first main face of heat radiation layer; a wiring circuit portion formed on the insulating layer; electronic components, including the rectifying device and switching device, which are electrically connected with the wiring circuit portion which is formed on the insulating layer; and a plurality of external terminals which are arranged in a row along the longitudinal sidewall of the power module and electrically connected with the wiring circuit portion; wherein the external terminals are configured to pass through the control circuit board thereby enabling the external terminals to electrically connect with the control circuit board.

5. The engine control unit according to claim 4, wherein the heat radiation layer is formed of a metallic material of high-heat conductance such as an aluminum alloying material or a copper alloying material.

6. The engine control unit according to claim 4, wherein the insulating layer is formed of an insulating resinous material of high-heat conductance.

7. The engine control unit according to claim 4, wherein the wiring circuit portion is formed of wirings made of a copper alloying material and having a thickness of not less than 100 µm.

8. The engine control unit according to claim 4, wherein the external terminals are respectively provided with a stepped portion at a connecting portion between the external terminals and the wiring circuit portion.

9. The engine control unit according to claim 4, wherein the injector comprises a first terminal for passing electric current for actuating the injector and a second terminal for transmitting controlling signals, wherein the first terminal has a width larger than that of the second terminal.

* * * * *